(12) United States Patent
Zhong

(10) Patent No.: US 12,072,456 B2
(45) Date of Patent: Aug. 27, 2024

(54) RADIATION DETECTION PROBE AND MANUFACTURING METHOD THEREFOR, AND RADIATION DETECTION CHIP

(71) Applicant: RATECTION CO., LTD, Guangdong (CN)

(72) Inventor: Huaqiang Zhong, Guangzhou (CN)

(73) Assignee: RATECTION CO., LTD. (CN)

( * ) Notice: Subject to any disclaimer, the term of this patent is extended or adjusted under 35 U.S.C. 154(b) by 148 days.

(21) Appl. No.: 17/786,798

(22) PCT Filed: Dec. 18, 2020

(86) PCT No.: PCT/CN2020/137434
§ 371 (c)(1),
(2) Date: Jun. 17, 2022

(87) PCT Pub. No.: WO2021/121353
PCT Pub. Date: Jun. 24, 2021

(65) Prior Publication Data
US 2023/0029541 A1    Feb. 2, 2023

(30) Foreign Application Priority Data
Dec. 18, 2019   (CN) .......................... 201911312863.1

(51) Int. Cl.
*G01T 1/24* (2006.01)
*H01L 31/0296* (2006.01)
(Continued)

(52) U.S. Cl.
CPC ........ *G01T 1/244* (2013.01); *H01L 31/02966* (2013.01); *H01L 31/115* (2013.01); *H01L 31/1832* (2013.01)

(58) Field of Classification Search
CPC . G01T 1/244; H01L 31/02966; H01L 31/115; H01L 31/1832
See application file for complete search history.

(56) References Cited

U.S. PATENT DOCUMENTS

| 4,767,929 A |   | 8/1988 | Valentine |
| 5,943,388 A | * | 8/1999 | Tumer ................... G01V 5/224 |
|             |   |        | 378/98.9 |

(Continued)

FOREIGN PATENT DOCUMENTS

| CN | 101074939 A | 11/2007 |
| CN | 101258421 A | 9/2008 |

(Continued)

OTHER PUBLICATIONS

I. Jung, H. Krawczyski, S. Komarov, L. Sobotka, Simulation studies of CZT Detectors as Gamma-Ray Calorimeter, Washington, University in St. Louis, Department of Physics, 1 Brookings Dr., CB, 1105 St. Louis MO 63130, arXiv: Astro-ph/0606258v1, Jun. 12, 2006. (Year: 2006).*

(Continued)

*Primary Examiner* — Hugh Maupin
(74) *Attorney, Agent, or Firm* — Polsinelli PC

(57) ABSTRACT

A radiation detection probe and a manufacturing method therefor, and a radiation detection chip. The method comprises: simulating each of a plurality of cadmium zinc telluride crystals having different three-dimensional sizes; obtaining the radiation response characteristics of each cadmium zinc telluride crystal; according to the radiation response characteristics, selecting a specific cadmium zinc telluride crystal from the plurality of cadmium zinc telluride crystals, wherein the specific cadmium zinc telluride crystal is a cadmium zinc telluride crystal having optimal performance indexes corresponding to the radiation response characteristics in the plurality of cadmium zinc telluride crystals; and configuring a first electrode and a second electrode for the specific cadmium zinc telluride crystal so as to constitute the radiation detection probe.

16 Claims, 5 Drawing Sheets

(51) Int. Cl.
*H01L 31/115* (2006.01)
*H01L 31/18* (2006.01)

(56) References Cited

U.S. PATENT DOCUMENTS

| | | | | |
|---|---|---|---|---|
| 6,191,422 | B1* | 2/2001 | Thurston | A61B 6/4258 250/367 |
| 8,120,683 | B1* | 2/2012 | Tumer | H01L 27/14634 348/295 |
| 2003/0105397 | A1 | 6/2003 | Tumer et al. | |
| 2004/0239377 | A1* | 12/2004 | Tumer | G01T 1/17 327/94 |
| 2005/0139757 | A1 | 6/2005 | Iwanczyk et al. | |
| 2007/0131868 | A1* | 6/2007 | Capote | H01L 27/14634 257/E31.016 |
| 2008/0042070 | A1* | 2/2008 | Levin | H04N 5/32 250/370.1 |
| 2009/0008733 | A1* | 1/2009 | Cardoso | H01L 27/14676 257/435 |
| 2014/0303932 | A1* | 10/2014 | Snow | G01J 3/28 702/180 |
| 2018/0188392 | A1* | 7/2018 | Polf | A61N 5/1049 |
| 2021/0121143 | A1* | 4/2021 | Iniewski | A61B 6/585 |

FOREIGN PATENT DOCUMENTS

| | | |
|---|---|---|
| CN | 101609155 A | 12/2009 |
| CN | 102822696 A | 12/2012 |
| CN | 103888084 A | 6/2014 |
| CN | 204086558 U | 1/2015 |
| CN | 104793232 A | 7/2015 |
| CN | 105589091 A | 5/2016 |
| CN | 103852778 A | 12/2016 |
| CN | 106371127 A | 2/2017 |
| CN | 107992699 A | 5/2018 |
| CN | 108072890 A | 5/2018 |
| CN | 108135540 A | 6/2018 |
| CN | 108279431 A | 7/2018 |
| CN | 108459339 A | 8/2018 |
| CN | 109143306 A | 1/2019 |
| CN | 109597112 A | 4/2019 |
| CN | 109799525 A | 5/2019 |
| CN | 109917443 A | 6/2019 |
| CN | 109932742 A | 6/2019 |
| CN | 110320547 A | 10/2019 |
| CN | 110460313 A | 11/2019 |
| CN | 110854242 A | 2/2020 |
| EP | 2975431 A2 | 1/2016 |
| JP | 2016018972 A | 2/2016 |
| JP | 2016029380 A | 2/2016 |
| JP | 2016153362 A | 8/2016 |
| TW | 537219 U | 6/2003 |
| WO | 2018201308 A1 | 11/2018 |
| WO | 2019155674 A1 | 8/2019 |

OTHER PUBLICATIONS

"Simulation studies of CZT Detectors as Gamma-Ray Calorimeter", by Jung et al. (Year: 2006).*
International Search Report dated Mar. 17, 2021 issued in corresponding Parent Application No. PCT/CN2020/137434 w/English Abstract (8 pages).
Written Opinion dated Mar. 17, 2021 issued in corresponding Parent Application No. PCT/CN2020/137434 w/English Abstract (5 pages).
First Office Action in related Chinese Application No. 201911311543.4, dated Jan. 15, 2024, 20 pages.
First Office Action in related Chinese Application No. 201911312863.1, dated Jan. 14, 2024, 14 pages.

* cited by examiner

RADIATION DETECTION PROBE AND MANUFACTURING METHOD THEREFOR, AND RADIATION DETECTION CHIP

CROSS-REFERENCES TO RELATED APPLICATIONS

This application is a National Phase of International Application No. PCT/CN2020/137434, filed on Dec. 18, 2020 which claims priority to Chinese patent application No. 201911312863.1, entitled "RADIATION DETECTION PROBE AND MANUFACTURING METHOD THEREFOR, AND RADIATION DETECTION CHIP" and filed with the Chinese patent office on Dec. 18, 2019, the entire contents of which are incorporated herein by reference.

TECHNICAL FIELD

The present disclosure relates to the technical field of radiation detection, and in particular, to a radiation detection probe and a manufacturing method therefor, and a radiation detection chip.

BACKGROUND

Radiation detection is a technical means to observe microscopic phenomena of a specific object through a radiation detector. The radiation detector is a core device of radiation detection, which mainly uses the principle of interaction between particles and matters to represent microscopic phenomena of nuclear radiation and particles as observable macroscopic phenomena. Conventional radiation detectors mainly include gas ionization detectors, semiconductor detectors, and scintillation detectors.

At present, with the development of nuclear physics, experimental physics, and other fields, performance of the radiation detectors is required to be increasingly high. The conventional radiation detectors are bulky and heavy due to technical limitations of radiation detection probes, which are difficult to meet application requirements of various fields.

SUMMARY

Based on the above, there is a need to provide a radiation detection probe and a manufacturing method therefor, and a radiation detection chip.

In one aspect, a manufacturing method for a radiation detection probe is provided, including: simulating each of a plurality of cadmium zinc telluride (CZT) crystals having different three-dimensional sizes; acquiring radiation response characteristics of each CZT crystal; selecting, based on the radiation response characteristics, a specific CZT crystal from the plurality of CZT crystals, the specific CZT crystal being a CZT crystal having optimal performance indexes corresponding to the radiation response characteristics in the plurality of CZT crystals; and configuring a first electrode and a second electrode for the specific CZT crystal so as to constitute the radiation detection probe.

In an embodiment, the simulating each of the plurality of CZT crystals having different three-dimensional sizes includes: performing Monte-Carlo simulation on each of the plurality of CZT crystals having different three-dimensional sizes.

In an embodiment, the three-dimensional size of the specific CZT crystal is $10\times10\times1$ mm$^3$.

In another aspect, a radiation detection probe is provided, including a first electrode, a second electrode, and the specific CZT crystal selected with the manufacturing method for a radiation detection probe according to any one of the above embodiments. The first electrode is arranged on a side of the specific CZT crystal, and configured to be coupled to a bias voltage. The second electrode is arranged on another side of the specific CZT crystal, and configured to be grounded.

In an embodiment, the specific CZT crystal is configured to detect high-energy particles. The high-energy particles interact with electrons of the specific CZT crystal within a PN junction to lose energy and form electron-hole pairs. Under an electric field of the PN junction, the electrons and the holes drift to the first electrode and the second electrode respectively to form a detection signal in an output loop between the first electrode and the second electrode.

In an embodiment, each of the first electrode and the second electrode is a metal electrode.

In an embodiment, the first electrode is a thin-sheet electrode, and the first electrode is arranged on a front surface of the specific CZT crystal configured to detect high-energy particles. The second electrode is a thin-sheet electrode, and the second electrode is arranged on a rear surface of the specific CZT crystal.

In an embodiment, each of the first electrode and the second electrode is a metal electrode in a PIN structure. The first electrode and the second electrode are coupled to the specific CZT crystal by gold wire bonding, tape bonding or flip chip bonding.

In an embodiment, the radiation detection probe includes a specific CZT crystal of a planar structure or a gate structure.

In another embodiment, the radiation detection probe includes a plurality of specific CZT crystals of planar structures or gate structures, and the plurality of specific CZT crystals of planar structures or gate structures are arranged in an array.

In a further aspect, a radiation detection chip is further provided, including a chip housing, and a pulse mode circuit, a current mode circuit, and the radiation detection probe according to any one of the above embodiments that are arranged in the chip housing. An output terminal of the radiation detection probe is coupled to an input terminal of the pulse mode circuit and an input terminal of the current mode circuit respectively.

In an embodiment, the pulse mode circuit includes a pre-amplifier unit and a secondary main amplifier unit. An input terminal of the pre-amplifier unit is configured to acquire a detection signal of the radiation detection probe when a dose rate of the radiation detection probe is less than or equal to a dose limit. An output terminal of the pre-amplifier unit is configured to be coupled to an external processor through the secondary main amplifier unit. The current mode circuit includes a current measuring unit and a current conversion unit. An input terminal of the current measuring unit is configured to acquire the detection signal of the radiation detection probe when the dose rate of the radiation detection probe is greater than the dose limit, and an output terminal of the current measuring unit is configured to be coupled to the external processor through the current conversion unit.

In an embodiment, the dose rate includes a current value and the dose limit includes a preset current value.

In an embodiment, the dose rate includes a charge value and the dose limit includes a preset charge value.

In an embodiment, the pulse mode circuit further includes an amplitude discriminator unit and a monostable trigger unit. The output terminal of the pre-amplifier unit is coupled to the external processor sequentially through the secondary main amplifier unit, the amplitude discriminator unit and the monostable trigger unit.

In an embodiment, the radiation detection chip further includes a built-in processor arranged in the chip housing. The output terminal of the pre-amplifier unit is coupled to the built-in processor through the secondary main amplifier unit. The output terminal of the current measuring unit is coupled to the built-in processor through the current conversion unit.

In an embodiment, the pre-amplifier unit includes a charge sensitive amplifier, and the secondary main amplifier unit includes a shaping filter circuit.

In an embodiment, the amplitude discriminator unit includes a discriminator or a first analog-to-digital conversion circuit, and the monostable trigger unit includes a monostable trigger circuit.

In an embodiment, a voltage comparison circuit is arranged at a rear stage of the discriminator or the first analog-to-digital conversion circuit.

In an embodiment, the current measuring unit includes a trans-impedance amplifier or a current sampling circuit. The current conversion unit includes a second analog-to-digital conversion circuit.

In an embodiment, a filter circuit is arranged at a rear stage of the trans-impedance amplifier or the current sampling circuit.

In an embodiment, the radiation detection chip further includes a booster module. The booster module is configured to be coupled to a chip-level voltage and boost the chip-level voltage, to cause the boosted chip-level voltage to provide a bias voltage for the radiation detection probe.

In an embodiment, the chip housing includes an electromagnetic shielding box.

Details of one or more embodiments of the present disclosure are set forth in the following accompanying drawings and descriptions. Other features, objectives, and advantages of the present disclosure will become apparent from the description, the accompanying drawings, and the claims.

BRIEF DESCRIPTION OF THE DRAWINGS

In order to more clearly illustrate the technical solutions in embodiments of the present disclosure, the accompanying drawings used in the description of the embodiments will be briefly introduced below. It is apparent that, the accompanying drawings in the following description are only some embodiments of the present disclosure, and other drawings can be acquired by those of ordinary skill in the art from the provided drawings without creative efforts.

In the drawings.

DETAILED DESCRIPTION OF THE EMBODIMENTS

In order to better understand the objectives, technical solutions, and technical effects of the present disclosure, the present disclosure is further described below with reference to the accompanying drawings and embodiments. It is also stated that the embodiments described below are intended only to explain and not to limit the present disclosure.

According to an embodiment of the present disclosure, a manufacturing method for a radiation detection probe is provided.

Figure 1:
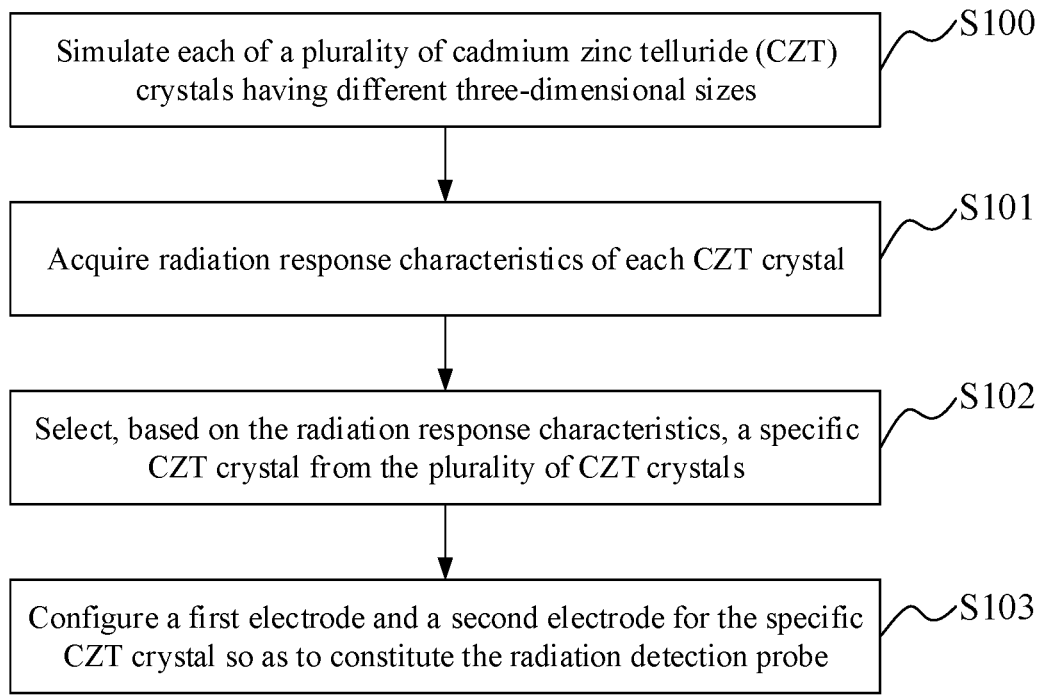
FIG. 1 is a flow diagram illustrating a manufacturing method for a radiation detection probe according to an embodiment.

FIG. 1 is a flow diagram illustrating a manufacturing method for a radiation detection probe according to an embodiment. As shown in FIG. 1, the manufacturing method for a radiation detection probe according to the embodiment includes the following steps.

In S100, each of a plurality of CZT crystals having different three-dimensional sizes is simulated.

In S101, the radiation response characteristics of each CZT crystal are acquired.

In S102, based on the radiation response characteristics, a specific CZT crystal is selected from the plurality of CZT crystals. The specific CZT crystal is a CZT crystal having optimal performance indexes corresponding to the radiation response characteristics in the plurality of CZT crystals.

In S103, a first electrode and a second electrode are configured for the specific CZT crystal so as to constitute the radiation detection probe.

CZT crystals having a variety of three-dimensional sizes are selected, and a bias voltage is applied to each CZT crystal. Electron-hole pairs are generated inside the CZT crystals in quantities proportional to energy deposited by incident rays in a sensitive volume. Negatively charged electrons and positively charged holes are collected at electrodes. A resulting charge pulse passes through a pre-amplifier and becomes a voltage pulse whose height is proportional to the energy of incident photons. Signals from the pre-amplifier are re-amplified by a main amplifier, and are collected by a counter or signal collector. The radiation response characteristics of the CZT crystals are calculated by simulating the collected signals. For example, relationships among size selection, some indexes (sensitivity of the radiation detection probe in Table 1), and bias voltages of the CZT crystals are shown in Table 1 below.

TABLE 1

Table of mapping between indexes and dimensions of CZT crystals

| Serial Number | CZT crystal size (mm³) | Sensitivity (Cs-137) (cps/(μSv/h)) | Bias Voltage (V) |
|---|---|---|---|
| 1 | 5 × 5 × 1 mm³ | 1.9 | 40 |
| 2 | 5 × 5 × 2 mm³ | 3.7 | 100 |
| 3 | 7 × 7 × 1 mm³ | 3.7 | 40 |
| 4 | 7 × 7 × 2 mm³ | 7 | 100 |
| 5 | 10 × 10 × 1 mm³ | 7.6 | 40 |
| 6 | 10 × 10 × 2 mm³ | 15 | 100 |

In an embodiment, after the determination of the collected signals, the radiation response characteristics of the CZT crystals can be calculated by Monte-Carlo simulation. As shown in Table 1, the sensitivity of the radiation probe formed by the CZT crystals to which bias voltages are applied determines performance indexes such as operating voltages, leakage currents, inherent noise, detection efficiency, energy responses, and angular responses. The radiation response characteristics of the CZT crystals include detection efficiency, energy responses and dose rate responses to different rays, and the like. The three-dimensional sizes of the CZT crystals are determined by integrating the radiation response characteristics of the CZT crystals. That is, a CZT crystal having optimal performance indexes corresponding to the radiation response characteristics is selected as the specific CZT crystal, so as to achieve better radiographic performance at a low bias voltage. Based on this, it is beneficial to balance the performance and process of the CZT crystals and to control a volume of the CZT crystals.

In an embodiment, the three-dimensional size of the specific CZT crystal is 10×10×1 mm$^3$.

The first electrode is configured to be coupled to a bias voltage, and the second electrode is configured to be grounded. Through the first electrode and the second electrode, the volume of the radiation detection probe can be effectively controlled based on volume and performance balance of the radiation detection probe configured by the CZT crystals, facilitating the application of the radiation detection probe to various fields.

According to an embodiment of the present disclosure, a radiation detection probe is further provided.

Figure 2:
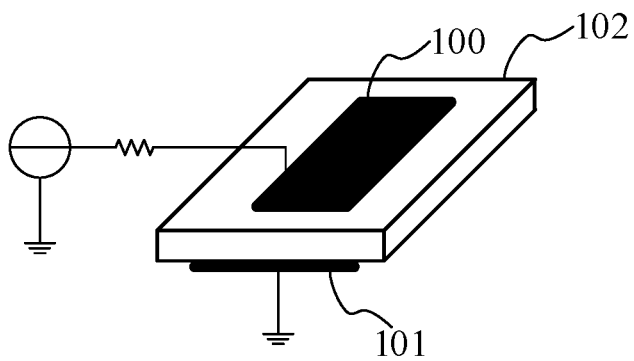
FIG. 2 is a schematic structural diagram illustrating a radiation detection probe according to an embodiment.

FIG. 2 is a schematic structural diagram illustrating a radiation detection probe 10 according to an embodiment. As shown in FIG. 2, the radiation detection probe 10 according to an embodiment may be manufactured with the manufacturing method for a radiation detection probe according to any one of the above embodiments. The radiation detection probe 10 includes a first electrode 100, a second electrode 101, and the specific CZT crystal 102 selected in step S102 of the manufacturing method for a radiation detection probe according to any one of the above embodiments. For example, the three-dimensional size of the specific CZT crystal 102 may be 10×10×1 mm$^3$. The first electrode 100 is arranged on a side of the specific CZT crystal 102, and configured to be coupled to a bias voltage. The second electrode 101 is arranged on another side of the specific CZT crystal 102, and configured to be grounded.

The first electrode 100 and the second electrode 101 are configured to form a bias voltage for the specific CZT crystal 102. The specific CZT crystal 102 is configured to detect high-energy particles, especially γ rays. As charged particles, the high-energy particles interact with electrons of the specific CZT crystal 102 in a PN junction, rapidly to lose energy and form electron-hole pairs. Under an electric field of the PN junction, the electrons and the holes drift to the two electrodes (the first electrode 100 and the second electrode 101) respectively to form a detection signal in an output loop between the first electrode 100 and the second electrode 101.

In an embodiment, each of the first electrode 100 and the second electrode 101 is a metal electrode.

In an embodiment, the first electrode 100 is a thin-sheet electrode, and arranged on a front surface of the specific CZT crystal 102. The front surface of the specific CZT crystal 102 is configured to detect high-energy particles.

In an embodiment, the second electrode 101 is a thin-sheet electrode, and arranged on a rear surface of the specific CZT crystal 102.

In an embodiment, the first electrode 100 and the second electrode 101 are metal electrodes having PIN structures. The first electrode 100 and the second electrode 101 may be coupled to the specific CZT crystal 102 by gold wire bonding, tape bonding or flip chip bonding. The metal electrodes having PIN structures and the specific CZT crystal 102 facilitate formation of a chip of the radiation detection probe 10.

In an embodiment, the radiation detection probe 10 includes one or more specific CZT crystals 102. The one specific CZT crystal 102 may be of a planar structure or a gate structure. Each of the specific CZT crystals 102 may be of a planar structure or a gate structure, and the specific CZT crystals 102 may be arranged in an array. It is to be understood that, in this embodiment, the structure type of the CZT crystal 102 in the radiation detection probe is not limited thereto.

In an embodiment, the three-dimensional size of the specific CZT crystal 102 is 10×10×1 mm$^3$.

According to the radiation detection probe 10 in any one of the above embodiments, volume and performance of the radiation detection probe 10 constituted by the specific CZT crystal 102 selected with the manufacturing method for a radiation detection probe in conjunction with the first electrode 100 and the second electrode 101 are balanced, which is beneficial to control the volume of the radiation detection probe 10 and facilitates the application of the radiation detection probe 10 in various fields.

According to an embodiment of the present disclosure, a radiation detection chip 20 is further provided.

Figure 3:
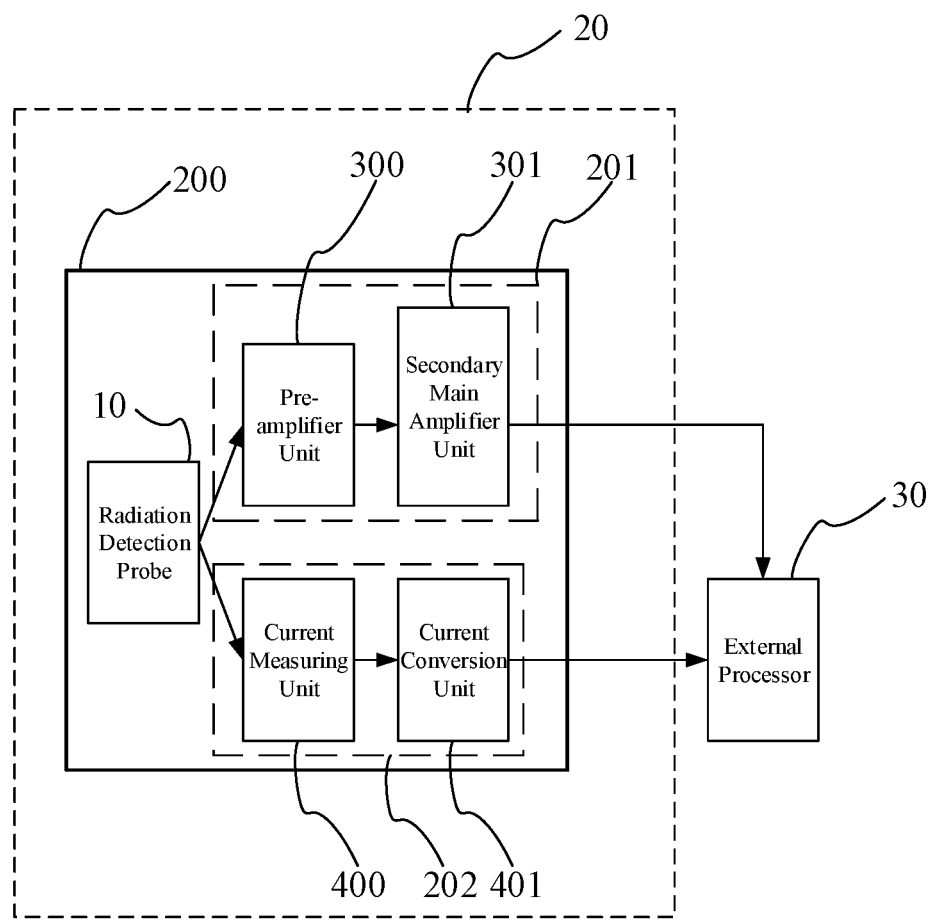
FIG. 3 is a schematic structural diagram illustrating circuit modules of a radiation detection chip according to an embodiment.

FIG. 3 is a schematic structural diagram illustrating circuit modules of a radiation detection chip 20 according to an embodiment. As shown in FIG. 3, the radiation detection chip 20 according to the embodiment includes a chip housing 200, and a pulse mode circuit 201, a current mode circuit 202, and the radiation detection probe 10 according to any one of the above embodiments that are arranged in the chip housing 200. An output terminal of the radiation detection probe 10 is coupled to an input terminal of the pulse mode circuit 201 and an input terminal of the current mode circuit 202 respectively.

In an embodiment, the pulse mode circuit 201 includes a pre-amplifier unit 300 and a secondary main amplifier unit 301. An input terminal of the pre-amplifier unit 300 is configured to acquire a detection signal of the radiation detection probe 10 when a dose rate of the radiation detection probe 10 is less than or equal to a dose limit. An output terminal of the pre-amplifier unit 300 is configured to be coupled to an external processor 30 through the secondary main amplifier unit 301.

The current mode circuit 202 includes a current measuring unit 400 and a current conversion unit 401. An input terminal of the current measuring unit 400 is configured to acquire the detection signal of the radiation detection probe 10 when the dose rate of the radiation detection probe 10 is greater than the dose limit. An output terminal of the current measuring unit 400 is configured to be coupled to the external processor through the current conversion unit 401.

In an embodiment, electrical signal magnitude of the detection signal is positively correlated with the dose rate. The dose rate includes a current value and the dose limit includes a preset current value; and/or the dose rate includes a charge value and the dose limit includes a preset charge value.

In an embodiment, the detection signal directly output by the radiation detection probe 10 is an ionized charge signal. The detection signal has no avalanche amplification process. The amount of charges of the detection signal generally ranges on the order from 0.1 fC to 100 fC, which is proportional to the deposition energy of ionizing radiation.

When the dose rate is less than or equal to the dose limit, the detection signal of the radiation detection probe 10 is acquired through the pulse mode circuit 201, and the number of output pulses is the same as the number of X/γ photons corresponding to the detection signal, and the external processor 30 obtains a detection result by calculation. When the dose rate is greater than the dose limit, which may exceed an upper limit of a counting rate of the pulse mode circuit 201, the current mode circuit 202 is adopted to convert a measured current into a voltage, and a detection result is calculated through the external processor 30. Based on this, wide-range detection of X/γ radiation by the radiation detection chip is realized by collaboration of a pulse readout mode and a current readout mode while a chip of the radiation detection device is formed.

Figure 4:
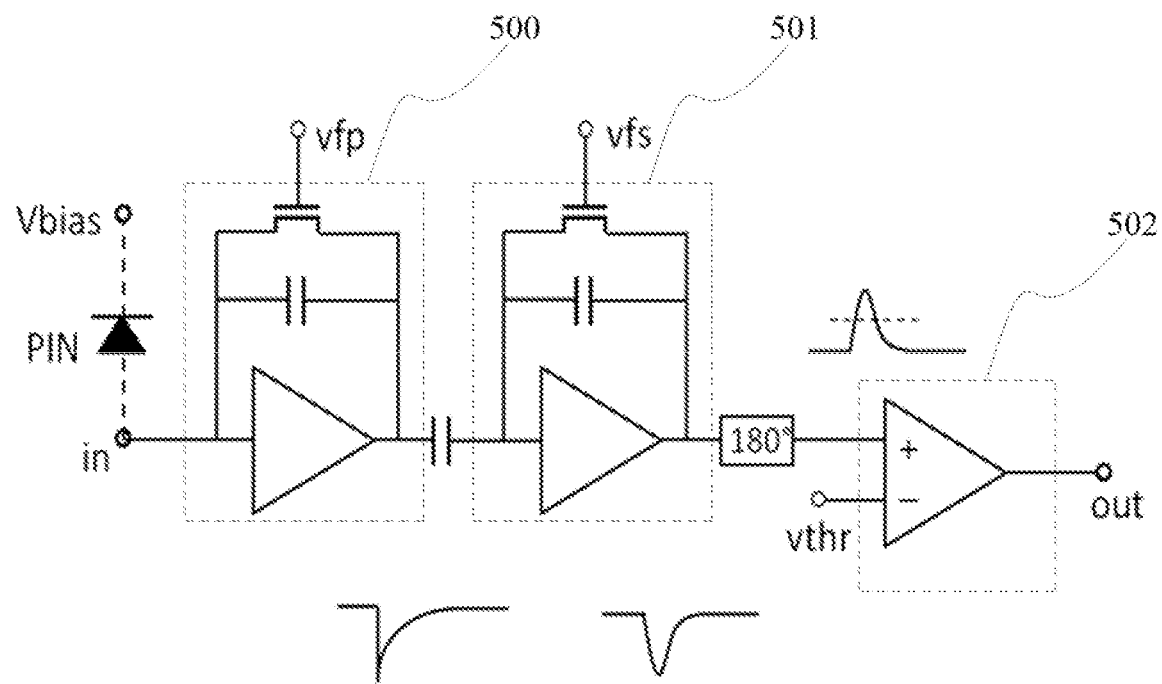
FIG. 4 is a diagram of a pulse mode circuit according to an embodiment.

In an embodiment, the pulse mode circuit 201 is optionally a discrete device combination circuit such as JFET and a transistor, a combination circuit such as JFET and an operational amplifier, or a Complementary Metal-Oxide-Semiconductor Transistor (CMOS)-based application-specific integrated circuit. In an embodiment, the pulse mode circuit 201 is optionally a CMOS-based application-specific integrated circuit. FIG. 4 is a diagram illustrating a pulse mode circuit 201 according to an embodiment. As shown in FIG. 4, under the CMOS-based application-specific integrated circuit, the pre-amplifier unit 300 includes a charge sensitive amplifier 500. The charge sensitive amplifier 500 is configured to convert a charge signal into a voltage signal. As first-stage amplification, noise performance and frequency characteristics thereof have the greatest influence on circuit characteristics. The secondary main amplifier unit 301 includes a shaping filter circuit 501. In an embodiment, the shaping filter circuit 501 is optionally a band-pass filter, configured to filter out frequency-band-independent signals and improve a signal to noise ratio of an output signal.

In an embodiment, as shown in FIG. 4, the pulse mode circuit 201 further includes an amplitude discriminator unit 302 coupled to a rear stage of the secondary main amplifier unit 301. The amplitude discriminator unit 302 includes a comparator 502. A digital signal is output through the comparator 502.

In an embodiment, in order to obtain low noise, low power consumption, and appropriate gain bandwidth, an appropriate process can be selected according to theoretical calculation and simulation results in a circuit diagram design stage, and parameters such as an aspect ratio of each transistor can be gradually adjusted. Since it is difficult to realize a high-resistance resistor in an integrated circuit, charges accumulated on feedback capacitors in the CMOS-based application-specific integrated circuit can be discharged by designing a discharge circuit.

Figure 5:
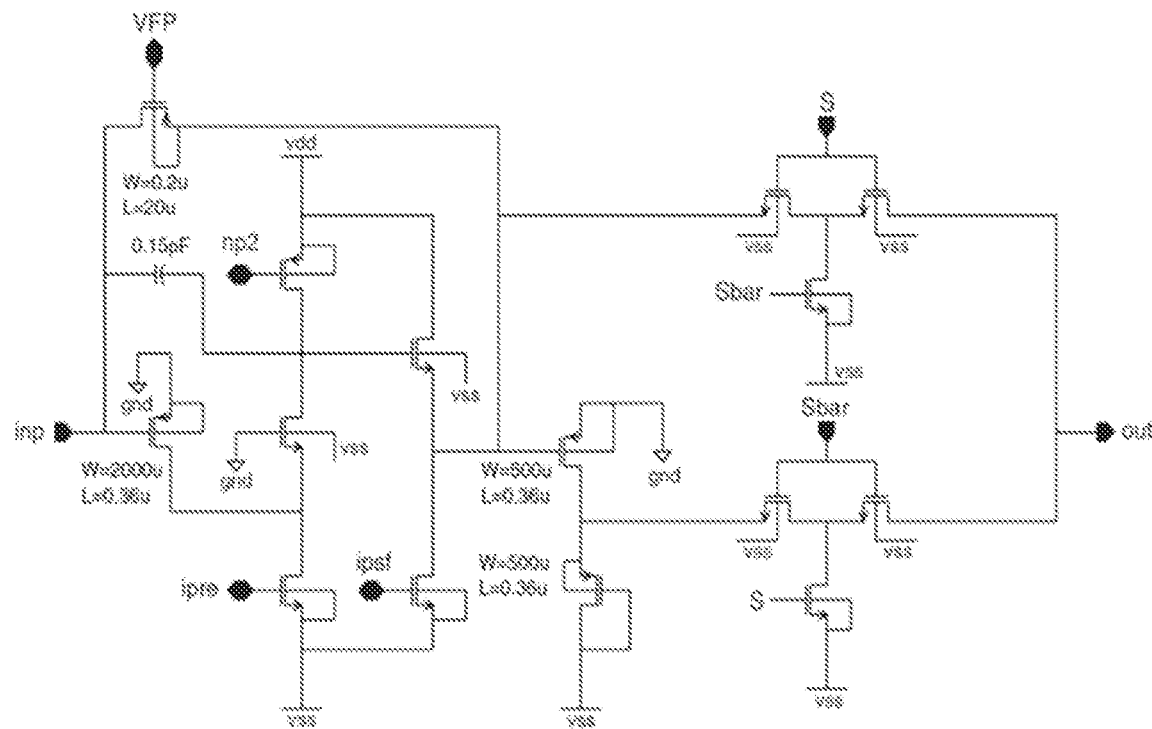
FIG. 5 is a design circuit diagram of a pre-amplifier unit according to an embodiment.

In an embodiment, FIG. 5 is a design circuit diagram of a pre-amplifier unit 300 according to an embodiment. As shown in FIG. 5, the pre-amplifier unit 300 according to the embodiment has beneficial effects of low noise, low power consumption, and appropriate gain bandwidth.

Figure 6:
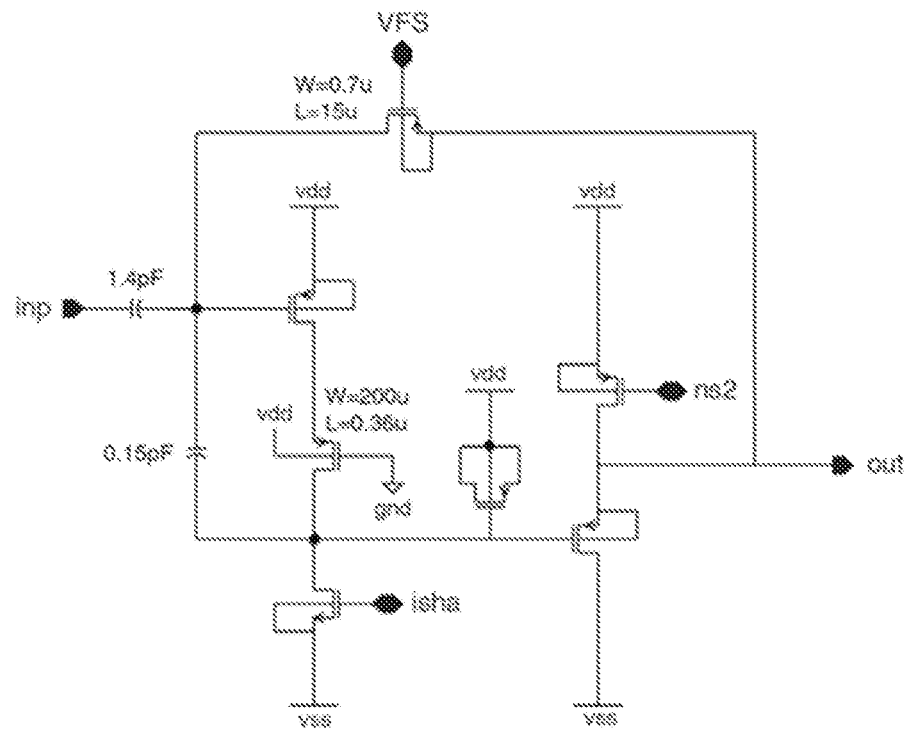
FIG. 6 is a design circuit diagram of a secondary main amplifier unit according to an embodiment.

In an embodiment, FIG. 6 is a design circuit diagram of a secondary main amplifier unit 301 according to an embodiment. As shown in FIG. 6, the secondary main amplifier unit 301 according to the embodiment can effectively increase a signal to noise ratio of an output signal of the secondary main amplifier unit 301.

Figure 7:
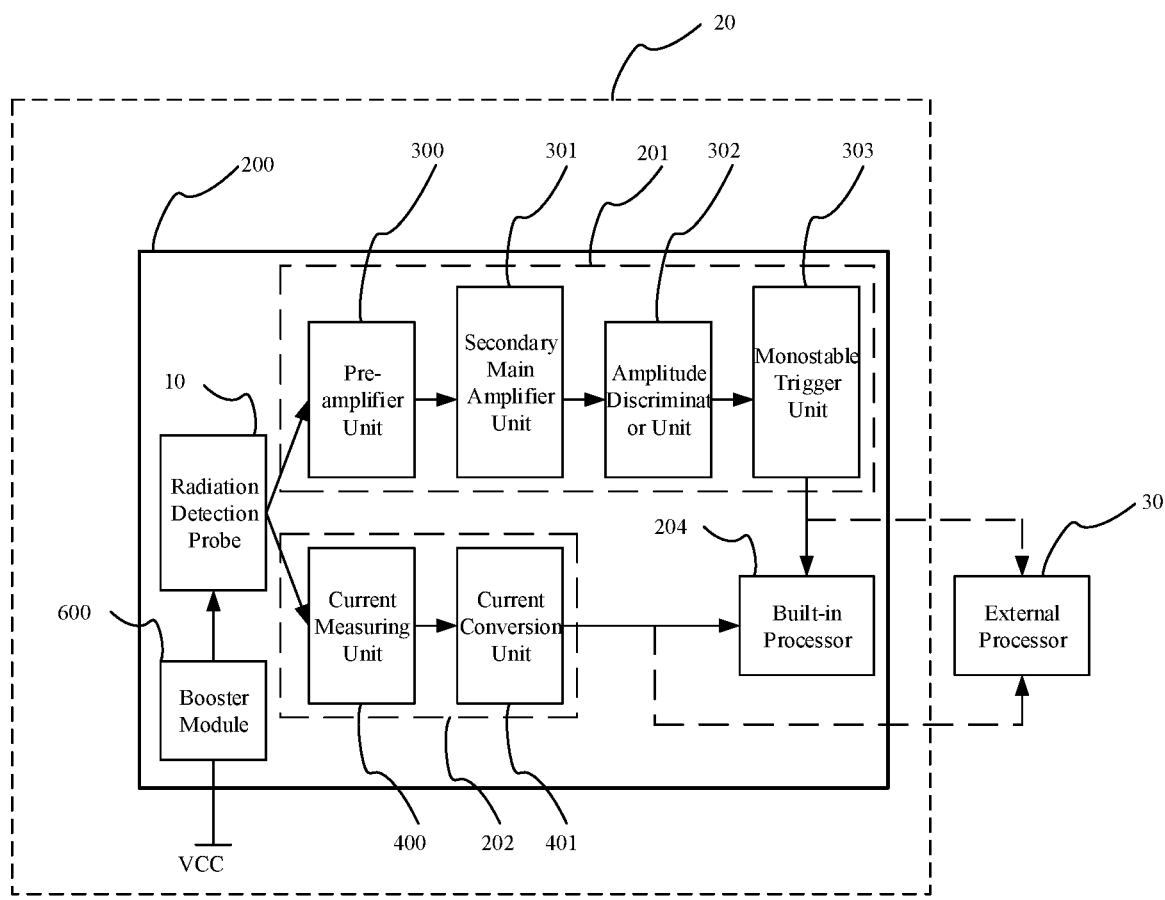
FIG. 7 is a schematic structural diagram illustrating circuit modules of the radiation detection chip according to another embodiment.

In an embodiment, FIG. 7 is a schematic structural diagram illustrating circuit modules of the radiation detection chip 20 according to another embodiment. As shown in FIG. 7, the pulse mode circuit 201 further includes an amplitude discriminator unit 302 and a monostable trigger unit 303. The output terminal of the pre-amplifier unit 300 is coupled to the external processor 30 sequentially through the secondary main amplifier unit 301, the amplitude discriminator unit 302 and the monostable trigger unit 303.

In an embodiment, as shown in FIG. 7, the radiation detection chip 20 further includes a built-in processor 204 arranged in the chip housing 200. The output terminal of the pre-amplifier unit 300 is coupled to the built-in processor 204 through the secondary main amplifier unit 301. The output terminal of the current measuring unit 400 is coupled to the built-in processor 204 through the current conversion unit 401. When the pulse mode circuit 201 further includes an amplitude discriminator unit 302 and a monostable trigger unit 303, as shown in FIG. 7, the output terminal of the pre-amplifier unit 300 is coupled to the built-in processor 204 sequentially through the secondary main amplifier unit 301, the amplitude discriminator unit 302 and the monostable trigger unit 303.

The radiation detection chip 20 may also replace the external processor 30 with the built-in processor 204 to realize self-calculation of detection results of the radiation detection chip 20 and improve the universality of the radiation detection chip 20.

In an embodiment, the amplitude discriminator unit 302 is optionally a discriminator or a first analog-to-digital conversion circuit, and a voltage comparison circuit is arranged at a rear stage of the discriminator or the first analog-to-digital conversion circuit to output an LVCMOS digital signal to the monostable trigger unit 303.

In an embodiment, the monostable trigger unit 303 is optionally a monostable trigger circuit. The monostable trigger unit 303 receives a digital signal output by the amplitude discriminator unit 302, converts the digital signal output by the amplitude discriminator unit 302 into a pulse signal, and sends the pulse signal to the external processor 30 or the built-in processor 204, so that the external processor 30 or the built-in processor 204 can calculate radiation detection results through the pulse signal.

In an embodiment, the current measuring unit 400 is optionally a trans-impedance amplifier or a current sampling circuit, configured to convert a current signal in the radiation detection probe 10 into voltage output. In an embodiment, a filter circuit is further arranged at a rear stage of the current measuring unit 400 to filter out high-frequency noise in the voltage output of the current measuring unit 400.

In an embodiment, the current conversion unit 401 is optionally a second analog-to-digital conversion circuit, configured to convert the voltage output of the current measuring unit 400 into a digital signal, so that the external processor 30 or the built-in processor 204 can calculate radiation detection results through the digital signal.

In an embodiment, as shown in FIG. 7, the radiation detection chip 20 according to another embodiment further includes a booster module 600.

The booster module 600 is configured to be coupled to a chip-level voltage and boost the chip-level voltage, to cause the boosted chip-level voltage to provide a bias voltage for the radiation detection probe 10.

In an embodiment, the booster module 600 is optionally a transformer coil or a booster chip. Preferably, the booster module 600 is optionally the booster chip.

In an embodiment, the chip housing 200 is optionally an electromagnetic shielding box. Circuits arranged in the chip housing 200 are distributed to improve electromagnetic compatibility.

In an embodiment, the chip housing 200 is provided with a chip substrate, and the pulse mode circuit 201, the current mode circuit 202, the built-in processor 204, and the radiation detection probe 10 are all fixed to the chip substrate. The pulse mode circuit 201, the current mode circuit 202, the built-in processor 204, and the radiation detection probe 10 are electrically coupled by gold wire bonding or flip chip bonding.

In an embodiment, the radiation detection chip 20 is further packaged by plastic package or ceramic package.

In an embodiment, the built-in processor 204 is optionally a single-chip microcomputer or a digital signal processor (DSP).

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A radiation detection chip, comprising a chip housing, and a pulse mode circuit, a current mode circuit, and a radiation detection probe that are arranged in the chip housing, an output terminal of the radiation detection probe being coupled to an input terminal of the pulse mode circuit and an input terminal of the current mode circuit respectively, the radiation detection probe, comprising:
    a first electrode;
    a second electrode; and
    a specific cadmium zinc telluride CZT crystal selected, based on radiation response characteristics, from a plurality of CZT crystals having different three-dimensional sizes, the specific CZT crystal having optimal performance indexes corresponding to the radiation response characteristics in the plurality of CZT crystals;
    wherein the first electrode is arranged on a side of the specific CZT crystal, and configured to be coupled to a bias voltage, and wherein the second electrode is arranged on another side of the specific CZT crystal, and configured to be grounded;
    wherein the pulse mode circuit includes a pre-amplifier unit and a secondary main amplifier unit, an input terminal of the pre-amplifier unit is configured to acquire a detection signal of the radiation detection probe when a dose rate of the radiation detection probe is less than or equal to a dose limit, and an output terminal of the pre-amplifier unit is configured to be coupled to an external processor through the secondary main amplifier unit; and
    wherein the current mode circuit includes a current measuring unit and a current conversion unit, an input terminal of the current measuring unit is configured to acquire the detection signal of the radiation detection probe when the dose rate of the radiation detection probe is greater than the dose limit, and an output terminal of the current measuring unit is configured to be coupled to the external processor through the current conversion unit.

2. The radiation detection chip according to claim 1, wherein the specific CZT crystal is configured to detect high-energy particles; and
    wherein the high-energy particles interact with electrons of the specific CZT crystal within a PN junction to lose energy and form electron-hole pairs, and under an electric field of the PN junction, the electrons and the holes drift to the first electrode and the second electrode respectively to form a detection signal in an output loop between the first electrode and the second electrode.

3. The radiation detection chip according to claim 1, wherein each of the first electrode and the second electrode is a metal electrode.

4. The radiation detection chip according to claim 1, wherein the first electrode is a thin-sheet electrode, and the first electrode is arranged on a front surface of the specific CZT crystal configured to detect high-energy particles; and
    wherein the second electrode is a thin-sheet electrode, and the second electrode is arranged on a rear surface of the specific CZT crystal.

5. The radiation detection chip according to claim 1, wherein each of the first electrode and the second electrode is a metal electrode in a PIN structure; and
    wherein the first electrode and the second electrode are coupled to the specific CZT crystal by gold wire bonding, tape bonding or flip chip bonding.

6. The radiation detection chip according to claim 1, wherein the radiation detection probe includes one specific CZT crystal of a planar structure or a gate structure; or
    wherein the radiation detection probe includes a plurality of specific CZT crystals of planar structures or gate structures, and the plurality of specific CZT crystals of planar structures or gate structures are arranged in an array.

7. The radiation detection chip according to claim 1, wherein the dose rate includes a current value, and the dose limit includes a preset current value; and/or
    the dose rate includes a charge value, and the dose limit includes a preset charge value.

8. The radiation detection chip according to claim 1, wherein the pulse mode circuit further includes an amplitude discriminator unit and a monostable trigger unit; and
    the output terminal of the pre-amplifier unit is coupled to the external processor sequentially through the secondary main amplifier unit, the amplitude discriminator unit and the monostable trigger unit.

9. The radiation detection chip according to claim 8, wherein the amplitude discriminator unit includes a discriminator or a first analog-to-digital conversion circuit, and the monostable trigger unit includes a monostable trigger circuit.

10. The radiation detection chip according to claim 9, wherein a voltage comparison circuit is arranged at a rear stage of the discriminator or the first analog-to-digital conversion circuit.

11. The radiation detection chip according to claim 1, further comprising a built-in processor arranged in the chip housing,
    wherein the output terminal of the pre-amplifier unit is coupled to the built-in processor through the secondary main amplifier unit, and the output terminal of the current measuring unit is coupled to the built-in processor through the current conversion unit.

12. The radiation detection chip according to claim 1, wherein the pre-amplifier unit includes a charge sensitive amplifier, and the secondary main amplifier unit includes a shaping filter circuit.

13. The radiation detection chip according to claim 1, wherein the current measuring unit includes a trans-impedance amplifier or a current sampling circuit, and the current conversion unit includes a second analog-to-digital conversion circuit.

14. The radiation detection chip according to claim 13, wherein a filter circuit is arranged at a rear stage of the trans-impedance amplifier or the current sampling circuit.

15. The radiation detection chip according to claim 1, further comprising a booster module,
   wherein the booster module is configured to be coupled to a chip-level voltage and boost the chip-level voltage, to cause the boosted chip-level voltage to provide a bias voltage for the radiation detection probe.

16. The radiation detection chip according to claim 1, wherein the chip housing includes an electromagnetic shielding box.

* * * * *